United States Patent
Shih et al.

(10) Patent No.: US 9,437,583 B1
(45) Date of Patent: Sep. 6, 2016

(54) PACKAGE-ON-PACKAGE ASSEMBLY AND METHOD FOR MANUFACTURING THE SAME

(71) Applicant: INOTERA MEMORIES, INC., Taoyuan (TW)

(72) Inventors: Shing-Yih Shih, New Taipei (TW); Neng-Tai Shih, New Taipei (TW)

(73) Assignee: INOTERA MEMORIES, INC., Taoyuan (TW)

( * ) Notice: Subject to any disclaimer, the term of this patent is extended or adjusted under 35 U.S.C. 154(b) by 0 days.

(21) Appl. No.: 15/134,396

(22) Filed: Apr. 21, 2016

Related U.S. Application Data

(62) Division of application No. 14/735,127, filed on Jun. 9, 2015.

(51) Int. Cl.
*H01L 25/10* (2006.01)

(52) U.S. Cl.
CPC ..... *H01L 25/105* (2013.01); *H01L 2225/1023* (2013.01); *H01L 2225/1041* (2013.01); *H01L 2225/1058* (2013.01)

(58) Field of Classification Search
CPC ........... H01L 25/0657; H01L 23/3157; H01L 23/49811; H01L 23/49822; H01L 23/49827; H01L 25/105; H01L 2225/06517; H01L 2225/06541; H01L 2225/1023; H01L 2225/1041; H01L 2225/1058
USPC ........................................................ 257/686
See application file for complete search history.

(56) References Cited

U.S. PATENT DOCUMENTS

| | | | |
|---|---|---|---|
| 2011/0037157 A1* | 2/2011 | Shin | H01L 23/49833 257/686 |
| 2012/0223429 A1 | 9/2012 | Khan | |
| 2013/0187292 A1* | 7/2013 | Semmelmeyer | H01L 25/0652 257/777 |
| 2014/0103527 A1 | 4/2014 | Marimuthu | |

* cited by examiner

*Primary Examiner* — Yasser A Abdelaziez
(74) *Attorney, Agent, or Firm* — Winston Hsu; Scott Margo

(57) ABSTRACT

A package-on-package (PoP) assembly includes a bottom die package and a top die package. The bottom die package includes an interposer having a first side and a second side, an active chip mounted on the first side within a chip mounting area through first bumps, and a dummy chip mounted on the first side within a peripheral area. The dummy chip is directly mounted on a passivation layer of the interposer. A dielectric layer covers the active chip and the dummy chip. At least one TSV connecter penetrates through the dielectric layer and the dummy chip. A molding compound is disposed on the first side. The molding compound covers the active chip and the TSV chip. Solder bumps are mounted on the second side.

4 Claims, 20 Drawing Sheets

PACKAGE-ON-PACKAGE ASSEMBLY AND METHOD FOR MANUFACTURING THE SAME

CROSS REFERENCE TO RELATED APPLICATIONS

This application is a division of U.S. application Ser. No. 14/735,127 filed Jun. 9, 2015, which is included in its entirety herein by reference.

BACKGROUND OF THE INVENTION

1. Field of the Invention

The present invention relates generally to the field of semiconductor packaging, and more particularly to a Package-on-Package (PoP) assembly and a method for manufacturing the same.

2. Description of the Prior Art

With recent advancements in the semiconductor manufacturing technology microelectronic components are becoming smaller and circuitry within such components is becoming increasingly dense. To reduce the dimensions of such components, the structures by which these components are packages and assembled with circuit boards must become more compact. In order to meet the requirements of smaller footprints with higher densities, 3D stacking packaging such as PoP (Package-on-Package) assembly has been developed.

A PoP assembly typically includes a top package with a device die bonded to a bottom package with another device die. In PoP designs, the top package may be interconnected to the bottom package through peripheral solder balls. However, the prior art PoP assembly is not able to provide very tight pitch stacking. Further, the prior art PoP assembly has large package form factor and poor warpage control.

In wafer level packaging, the wafer and the dies mounted on the wafer are typically covered with a relatively thick layer of the molding compound. The thick layer of the molding compound results in increased warping of the packaging due to coefficient of thermal expansion (CTE) mismatch, and the thickness of the packaging. It is known that wafer warpage continues to be a concern. Warpage can prevent successful assembly of a die-to-wafer stack because of the inability to maintain the coupling of the die and wafer. Warpage issue is serious especially in a large sized wafer, and has raised an obstacle to a wafer level semiconductor packaging process that requires fine-pitch RDL process.

SUMMARY OF THE INVENTION

One object of the present invention is to provide a semiconductor device having package-on-package (PoP) configuration.

In one aspect of the invention, a package-on-package (PoP) assembly includes a bottom die package and a top die package mounted on the bottom die package. The bottom die package includes an interposer having a first side and a second side opposite to the first side; at least one active chip mounted on the first side within a chip mounting area through a plurality of first bumps; at least one through-substrate-via (TSV) chip mounted on the first side within a peripheral area being adjacent to the chip mounting area, wherein the TSV chip comprises at least one TSV connecter and is mounted on the first side through a plurality of second bumps arranged within the peripheral area; a molding compound disposed on the first side, the molding compound covering the at least one active chip and the at least one TSV chip; and a plurality of solder bumps mounted on the second side.

According to one embodiment of the invention, the top die package is mounted on the bottom die package through a plurality of third bumps disposed on the TSV chip.

In one aspect of the invention, a package-on-package (PoP) assembly includes a bottom die package and a top die package mounted on the bottom die package. The bottom die package includes an interposer having a first side and a second side opposite to the first side; at least one active chip mounted on the first side within a chip mounting area through a plurality of first bumps; at least one dummy chip mounted on the first side within a peripheral area being adjacent to the chip mounting area, wherein the dummy chip is directly mounted on a passivation layer of the interposer; a dielectric layer covering the at least one active chip and the at least one dummy chip; at least one TSV connecter penetrating through the dielectric layer and the dummy chip; a molding compound disposed on the first side, the molding compound covering the at least one active chip and the at least one TSV chip; and a plurality of solder bumps mounted on the second side.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

Figure 1:
FIG. 1 to FIG. 9 are schematic, cross-sectional diagrams showing an exemplary method for fabricating a package-on-package (PoP) assembly according to one embodiment of the invention.

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled.

One or more implementations of the present invention will now be described with reference to the attached drawings, wherein like reference numerals are used to refer to like elements throughout, and wherein the illustrated structures are not necessarily drawn to scale. The terms "die", "semiconductor chip", and "semiconductor die" are used interchangeable throughout the specification.

The terms wafer and substrate used herein include any structure having an exposed surface onto which a layer is deposited according to the present invention, for example, to form the circuit structure such as a redistribution layer (RDL). The term substrate is understood to include semiconductor wafers, but not limited thereto. The term substrate is also used to refer to semiconductor structures during processing, and may include other layers that have been fabricated thereupon.

Please refer to FIG. 1 to FIG. 9. FIG. 1 to FIG. 9 are schematic, cross-sectional diagrams showing an exemplary method for fabricating a package-on-package (PoP) assembly according to one embodiment of the invention.

As shown in FIG. 1, a carrier 300 is prepared. The carrier 300 may be a releasable substrate material with an adhesive layer (not explicitly shown), but not limited thereto. At least a dielectric layer or a passivation layer 310 is then formed on a top surface of the carrier 300. The passivation layer 310 may comprise organic materials such as polyimide (PI) or inorganic materials such as silicon nitride, silicon oxide or the like.

Figure 2:
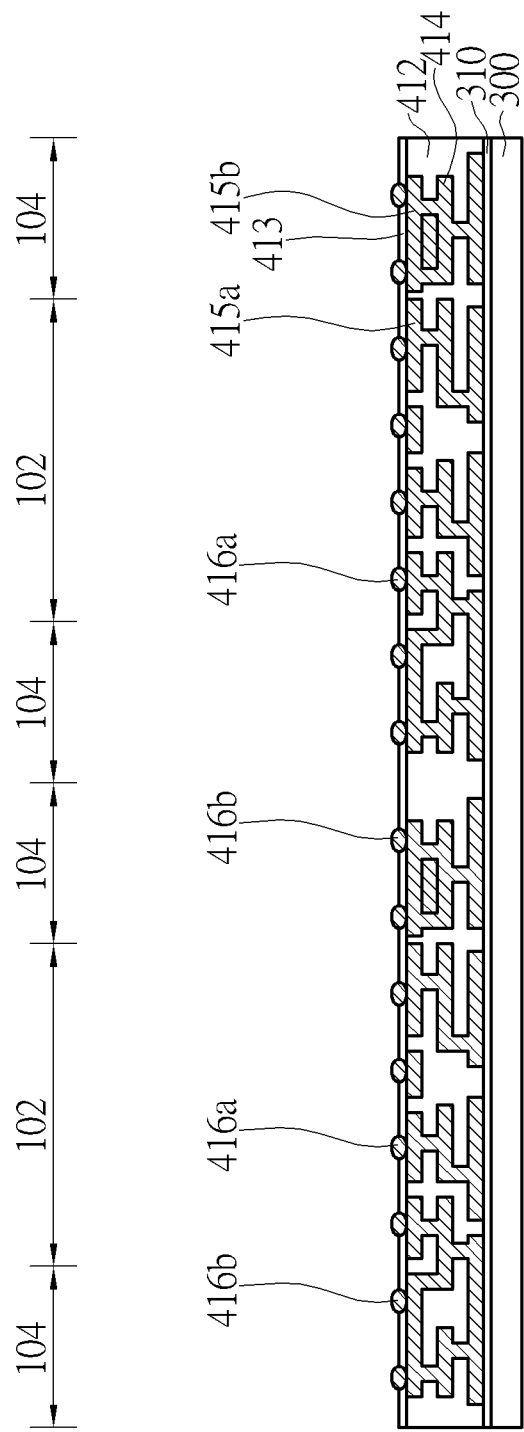

As shown in FIG. 2, subsequently, a redistribution layer (RDL) 410 is formed on the passivation layer 310. The RDL 410 may comprise at least one dielectric layer 412 and at least one metal layer 414. The dielectric layer 412 may comprise organic materials such as polyimide (PI) or inorganic materials such as silicon nitride, silicon oxide or the like, but not limited thereto. The metal layer 414 may comprise aluminum, copper, tungsten, titanium, titanium nitride, or the like.

According to the illustrated embodiment, the metal layer 414 may comprise a plurality of first bump pads 415a and second bump pads 415b exposed from a top surface of the dielectric layer 412. The first bump pads 415a are disposed within a chip mounting area 102, while the dummy pads 415b are disposed outside the chip mounting area such as a peripheral area 104 around the chip mounting area 102.

Subsequently, a passivation layer 413 such as polyimide or solder mask material may be formed on the dielectric layer 412. The passivation layer 413 may include openings (not explicitly shown) that expose the respective first and second bump pads 415a and 415b. A conventional electroplating solder bumping process may be performed to form first bumps 416a and second bumps 416b on the respective first and second bump pads 415a and 415b.

Figure 3:
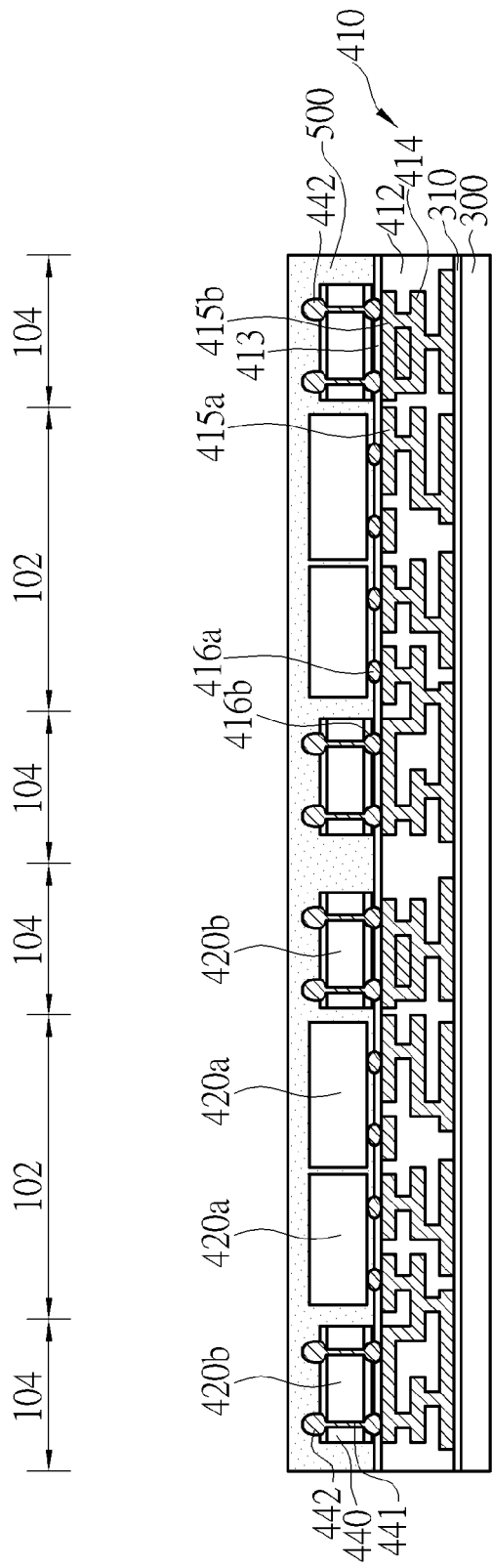

As shown in FIG. 3, subsequently, individual flip-chips or dies 420a with their active sides facing down toward the RDL 410 are then mounted on the RDL 410 through the first bumps 416a to thereby forming a stacked chip-to-wafer (C2W) construction. These individual flip-chips or dies 420a are active integrated circuit chips with certain functions, for example, GPU (graphic processing unit), CPU (central processing unit), memory chips, etc.

According to the illustrated embodiment, a plurality of TSV chips 420b are mounted in the peripheral area 104 around the chip mounting area 102 through the second bumps 416b. Each of the TSV chips 420b may comprise a substrate 440 such as a silicon substrate. A plurality of through substrate via (TSV) connecters 441 fabricated within the substrate 440. A plurality of bumps 442 may be formed on a top surface of the substrate 440 opposite to the second bumps 416b.

Optionally, an underfill (not shown) may be applied under each chip 420a/420b. Thereafter, a thermal process may be performed to reflow the first bumps 416a and second bumps 416b.

After the chip-bonding process, a molding compound 500 is applied. The molding compound 500 covers the attached active chips 420a and the TSV chips 420b and the top surface of the RDL 410. The molding compound 500 may be subjected to a curing process. The mold compound 500 may comprise a mixture of epoxy and silica fillers, but not limited thereto.

Figure 4:
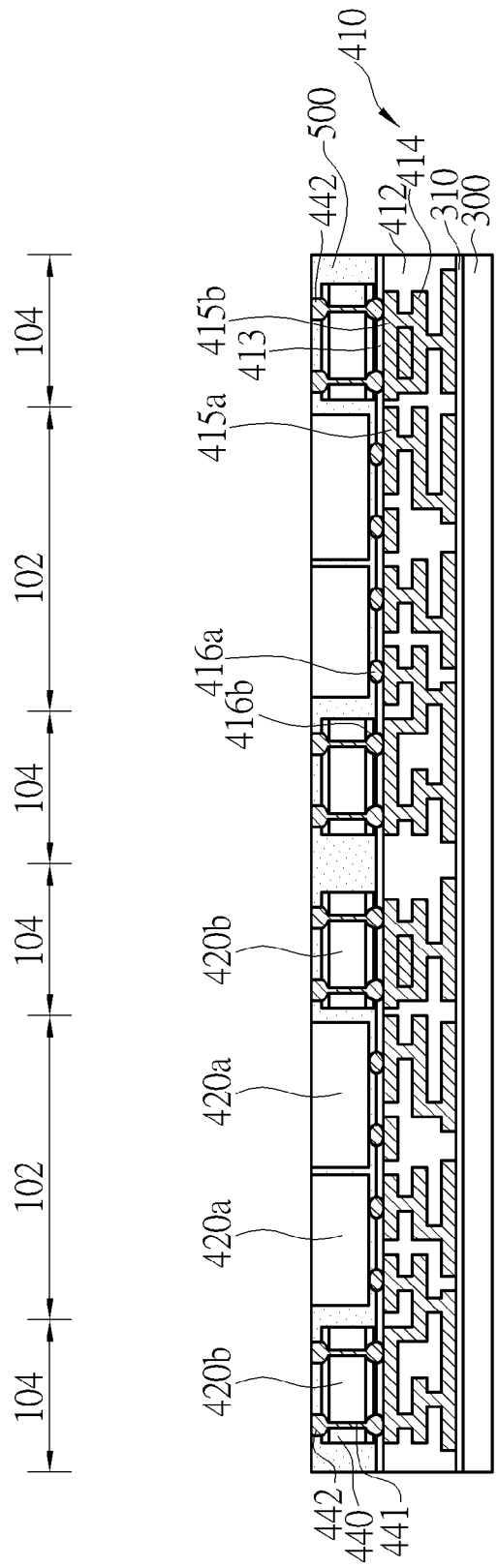

As shown in FIG. 4, a top portion of the molding compound 500 may be polished away to expose top surfaces of the active chips 420a and a portion of the bumps 442 of the TSV chips 420b. During the molding compound grinding process, a portion of the chips 420a may be removed, but not limited thereto. At this point, the top surfaces of the active chips 420a are flush with the top surface of the molding compound 500.

Figure 5:
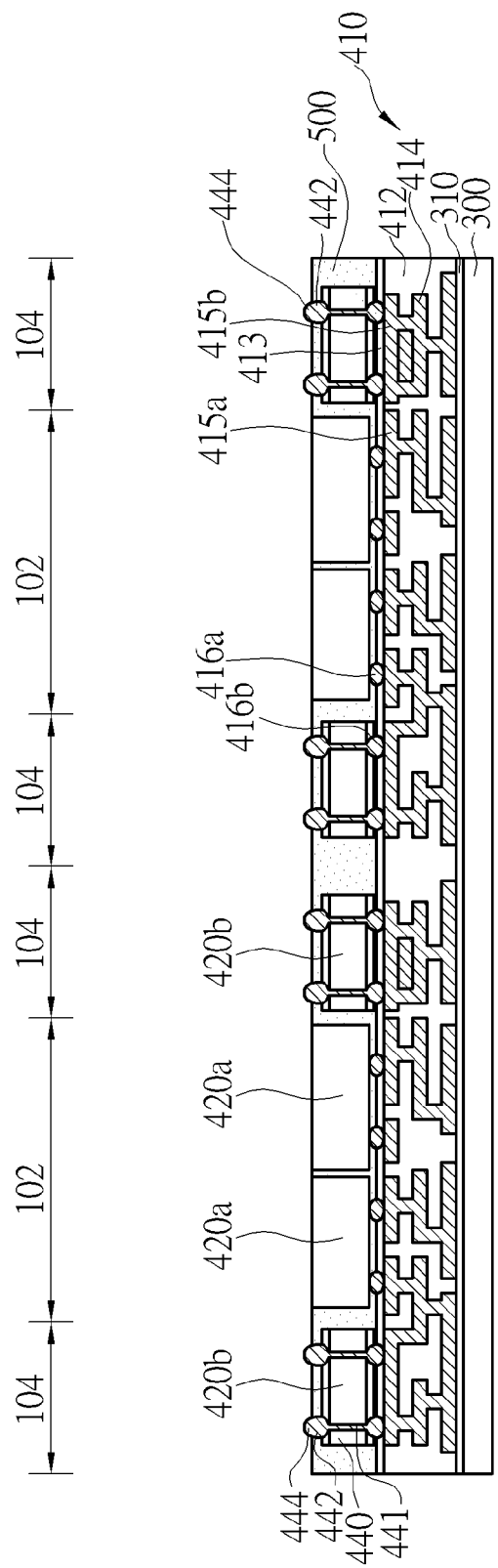

As shown in FIG. 5, a bump forming process is performed to form bumps 444 directly and respectively on the exposed bumps 442 of the TSV chips 420b. These bumps 444 protrude from the top surface of the molding compound 500 for further connections. According to the illustrated embodiment, the bumps 444 may be formed by using electroplating methods, but not limited thereto. The bumps 444 may comprise copper, nickel, tin, or any suitable solderable material known in the art.

Figure 6:
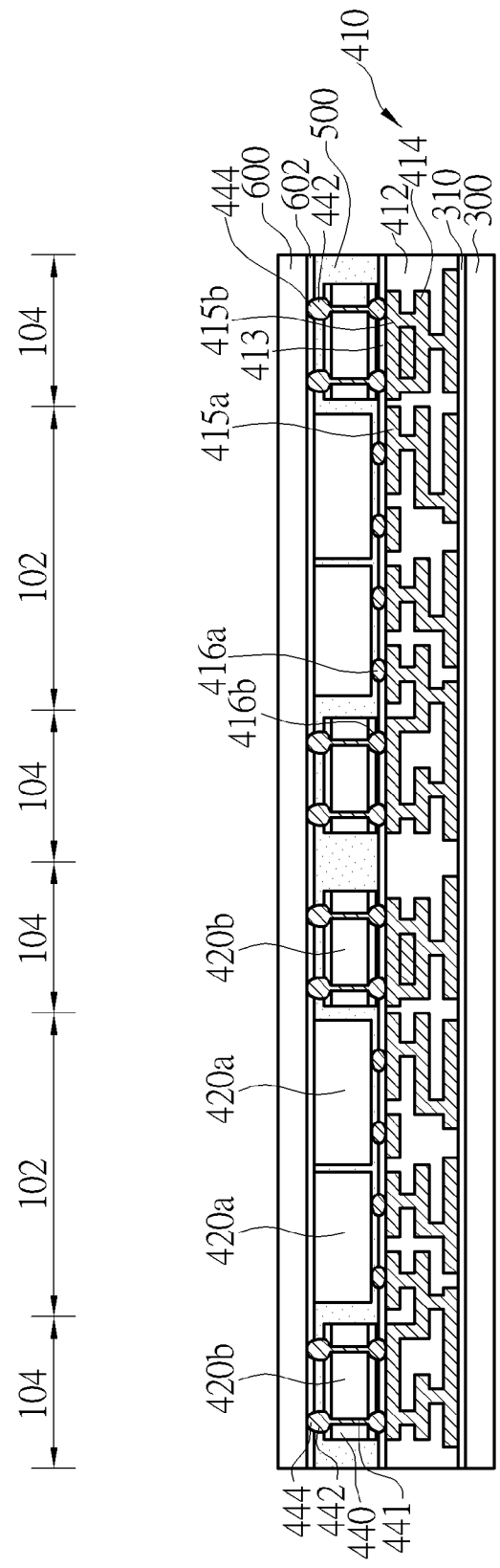

As shown in FIG. 6, the wafer level package is then adhered to another carrier 600. The bumps 444 face toward, and may contact, the carrier 600. The carrier 600 may be a glass substrate, but not limited thereto. Optionally, an adhesive layer or a glue layer 602 may be used. Subsequently, the carrier 300 is removed to thereby expose a major surface of the passivation layer 310. The RDL 410 and the passivation layer 310 function as an interposer. The de-bonding of the carrier 300 may be performed by using a laser process or UV irradiation process, but not limited thereto.

Figure 7:
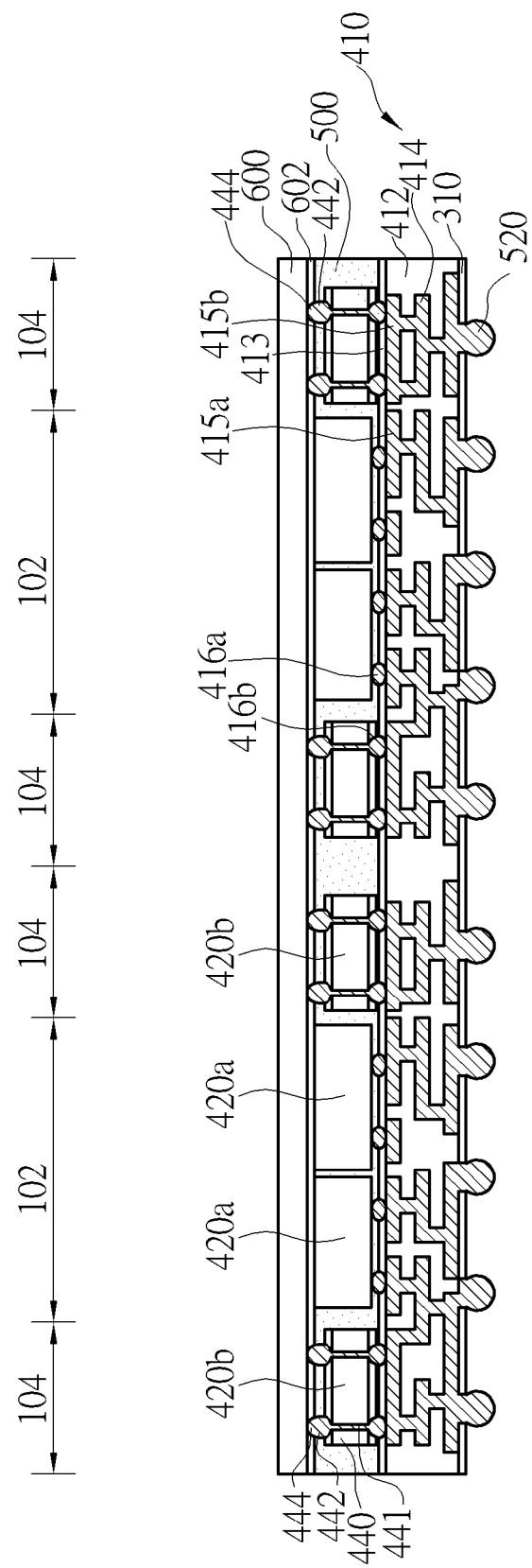

As shown in FIG. 7, after de-bonding the carrier 300, openings may be formed in the passivation layer 310 to expose respective solder pads, and then solder bumps or solder balls 520 may be formed on the respective solder pads. Thereafter, the carrier 600 and the adhesive layer 602 are removed to expose the bumps 444.

Figure 8:
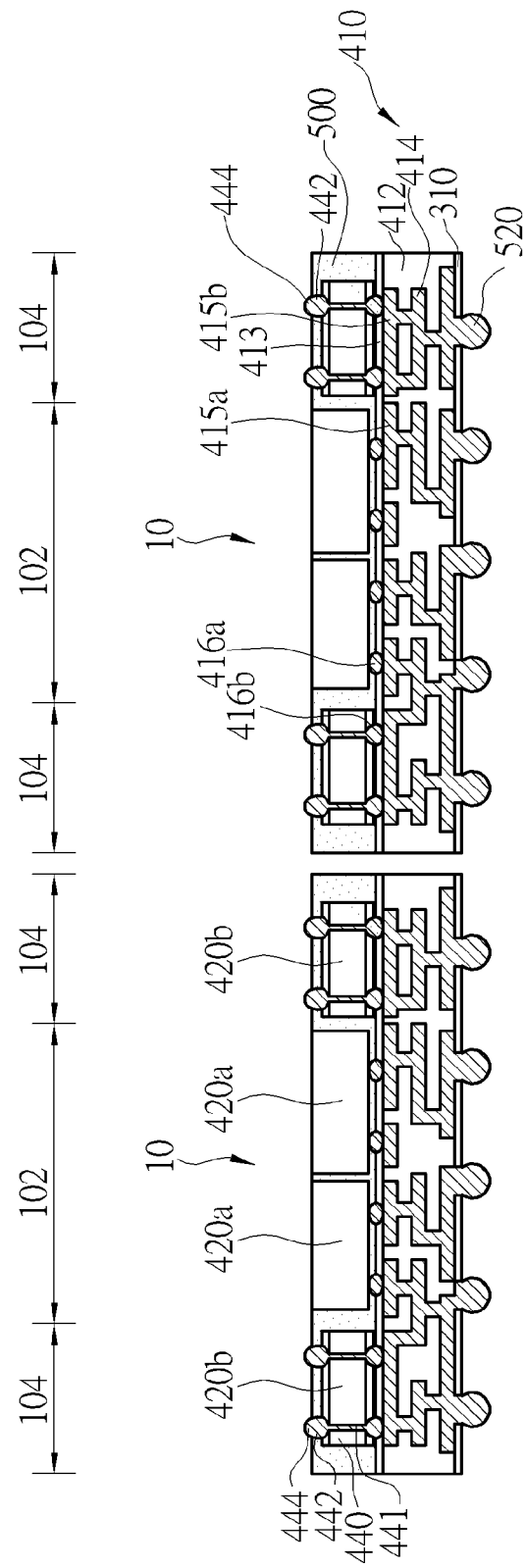

As shown in FIG. 8, after the carrier 600 and the adhesive layer 602 are removed, the wafer level package is then diced and singulated into individual die package 10. For example, the wafer level package may be first attached to a dicing tape (not shown), where the bumps 520 face toward, and may contact, the dicing tape.

Figure 9:
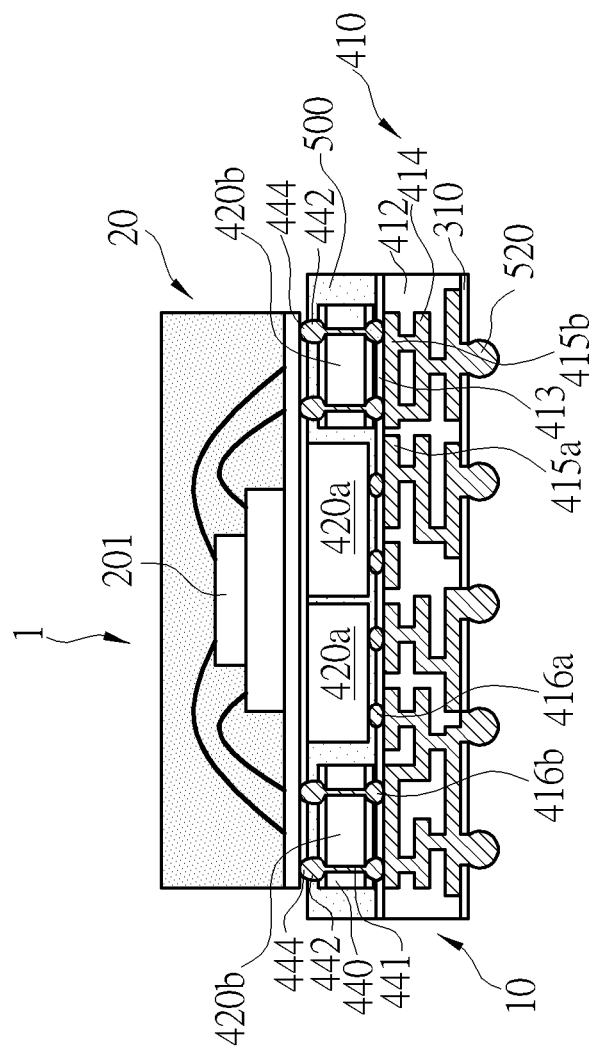

As shown in FIG. 9, a die package 20 comprising at least a molded semiconductor die 201 is mounted on the die package 10 to thereby form a PoP assembly 1. The die package 20 may be electrically connected to the die package 10 through the bumps 444 and the TSV chips 420b.

It is advantageous to use the invention because most of the peripheral area 104 around the chip mounting area 102 is occupied by the TSV chips 420b, the used amount of the molding compound 500 is reduced, and therefore the warpage of the wafer or die package is alleviated or avoided.

Please refer to FIG. 10 to FIG. 20. FIG. 10 to FIG. 20 are schematic, cross-sectional diagrams showing an exemplary method for fabricating a package-on-package (PoP) assembly according to another embodiment of the invention, wherein like numeral numbers designate like layers, regions, or elements.

Figure 10:
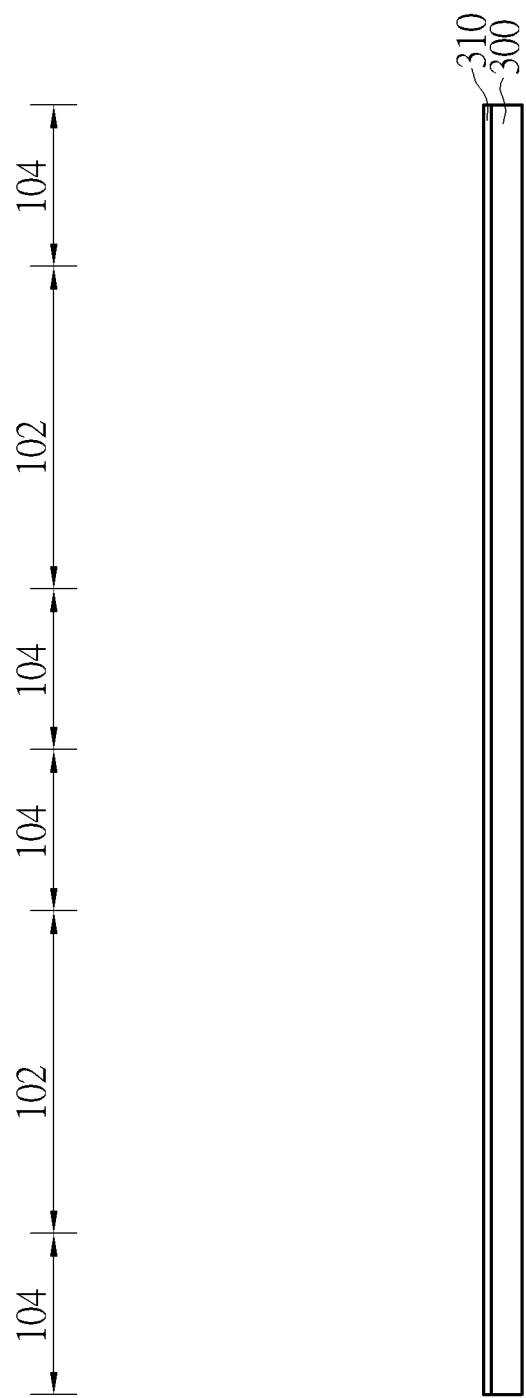
FIG. 10 to FIG. 20 are schematic, cross-sectional diagrams showing an exemplary method for fabricating a package-on-package (PoP) assembly according to another embodiment of the invention.

As shown in FIG. 10, likewise, a carrier 300 is prepared. The carrier 300 may be a releasable substrate material with an adhesive layer (not explicitly shown), but not limited thereto. At least a dielectric layer or a passivation layer 310 is then formed on a top surface of the carrier 300. The passivation layer 310 may comprise organic materials such as polyimide (PI) or inorganic materials such as silicon nitride, silicon oxide or the like.

Figure 11:
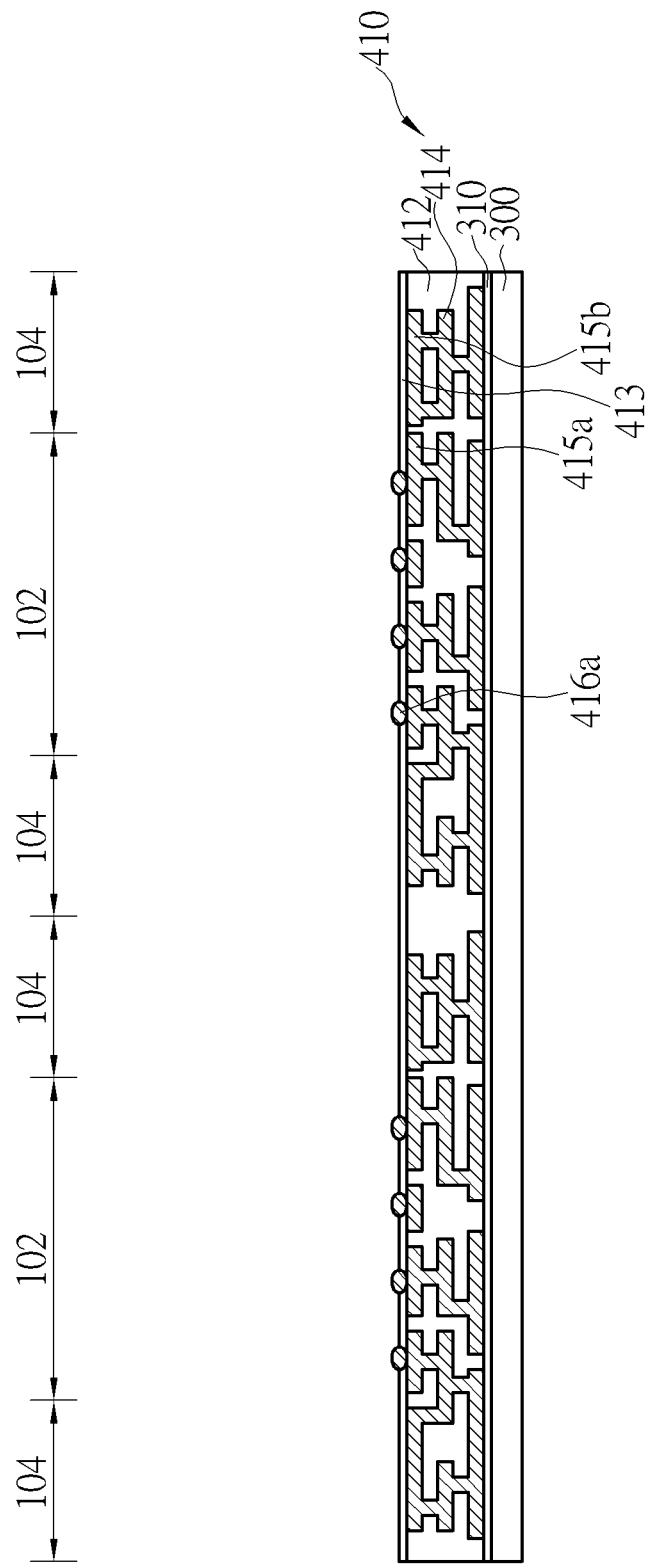

As shown in FIG. 11, subsequently, a redistribution layer (RDL) 410 is formed on the passivation layer 310. The RDL 410 may comprise at least one dielectric layer 412 and at least one metal layer 414. The dielectric layer 412 may comprise organic materials such as polyimide (PI) or inorganic materials such as silicon nitride, silicon oxide or the like, but not limited thereto. The metal layer 414 may comprise aluminum, copper, tungsten, titanium, titanium nitride, or the like.

According to the illustrated embodiment, the metal layer 414 may comprise a plurality of bump pads 415a exposed from a top surface of the dielectric layer 412. The bump pads 415a are disposed within a chip mounting area 102. The metal layer 414 may comprise a plurality of pads 415b disposed within a peripheral area 104 around the chip mounting area 102.

Subsequently, a passivation layer 413 such as polyimide or solder mask material may be formed on the dielectric layer 412. The passivation layer 413 may include openings (not explicitly shown) that expose the respective bump pads 415a. A conventional electroplating solder bumping process may be performed to form bumps 416a on the respective bump pads 415a.

Figure 12:
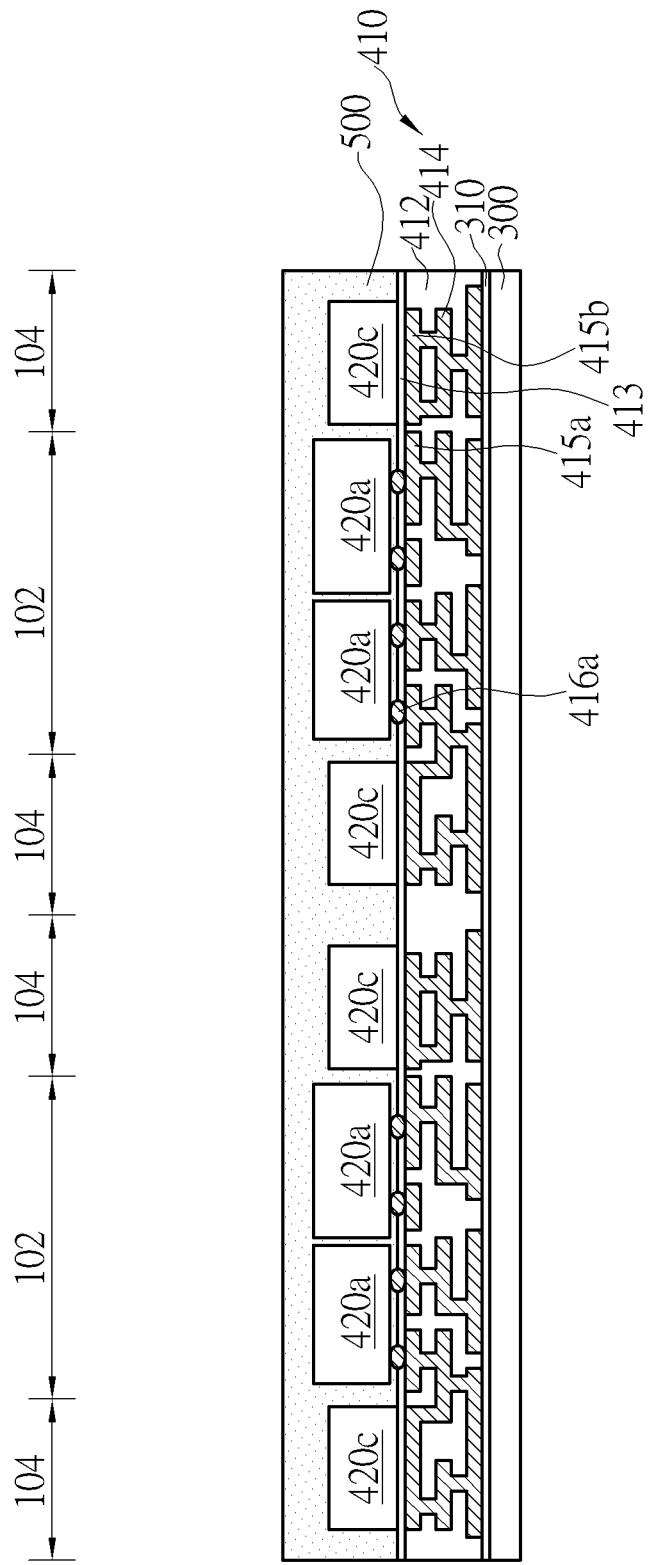

As shown in FIG. 12, subsequently, individual flip-chips or dies 420a with their active sides facing down toward the RDL 410 are then mounted on the RDL 410 through the first bumps 416a to thereby forming a stacked chip-to-wafer (C2W) construction. These individual flip-chips or dies 420a are active integrated circuit chips with certain functions, for example, GPU (graphic processing unit), CPU (central processing unit), memory chips, etc.

According to the illustrated embodiment, a plurality of dummy chips (or warpage-control chips) 420c are mounted in the peripheral area 104 around the chip mounting area 102. According to the illustrated embodiment, the dummy chips 420c may comprise silicon or dummy silicon chip. According to the illustrated embodiment, the dummy chips 420c may be attached onto the passivation layer 413 by using an adhesive (not shown).

Optionally, an underfill (not shown) may be applied under each chip 420a. Thereafter, a thermal process may be performed to reflow the first bumps 416a.

After the chip-bonding process, a molding compound 500 is applied. The molding compound 500 covers the attached active chips 420a and the dummy chips 420c and the top surface of the RDL 410. The molding compound 500 may be subjected to a curing process. The mold compound 500 may comprise a mixture of epoxy and silica fillers, but not limited thereto.

Figure 13:
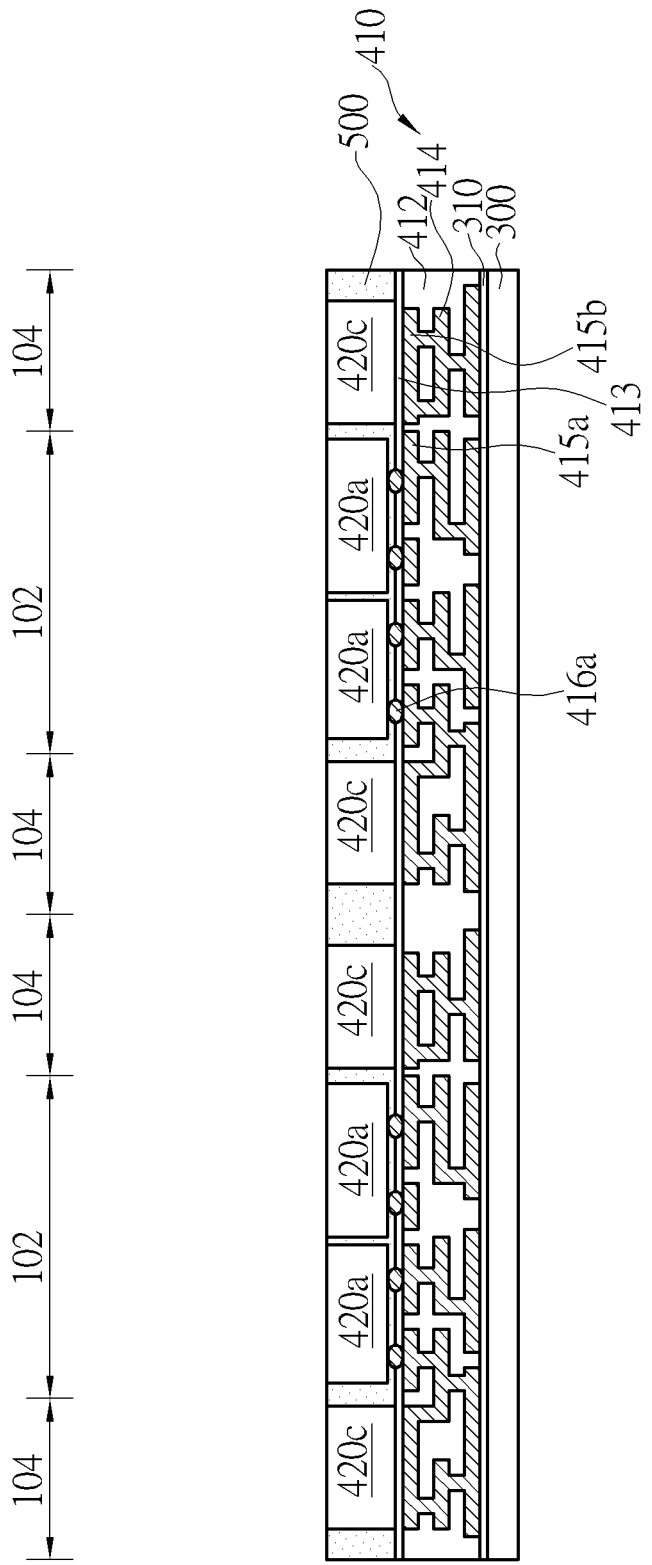

As shown in FIG. 13, likewise, a top portion of the molding compound 500 may be polished away to expose top surfaces of the active chips 420a and top surfaces of the dummy chips 420c. During the molding compound grinding process, a portion of the chips 420a may be removed, but not limited thereto. At this point, the top surfaces of the active chips 420a and the top surfaces of the dummy chips 420c are flush with the top surface of the molding compound 500.

Figure 14:
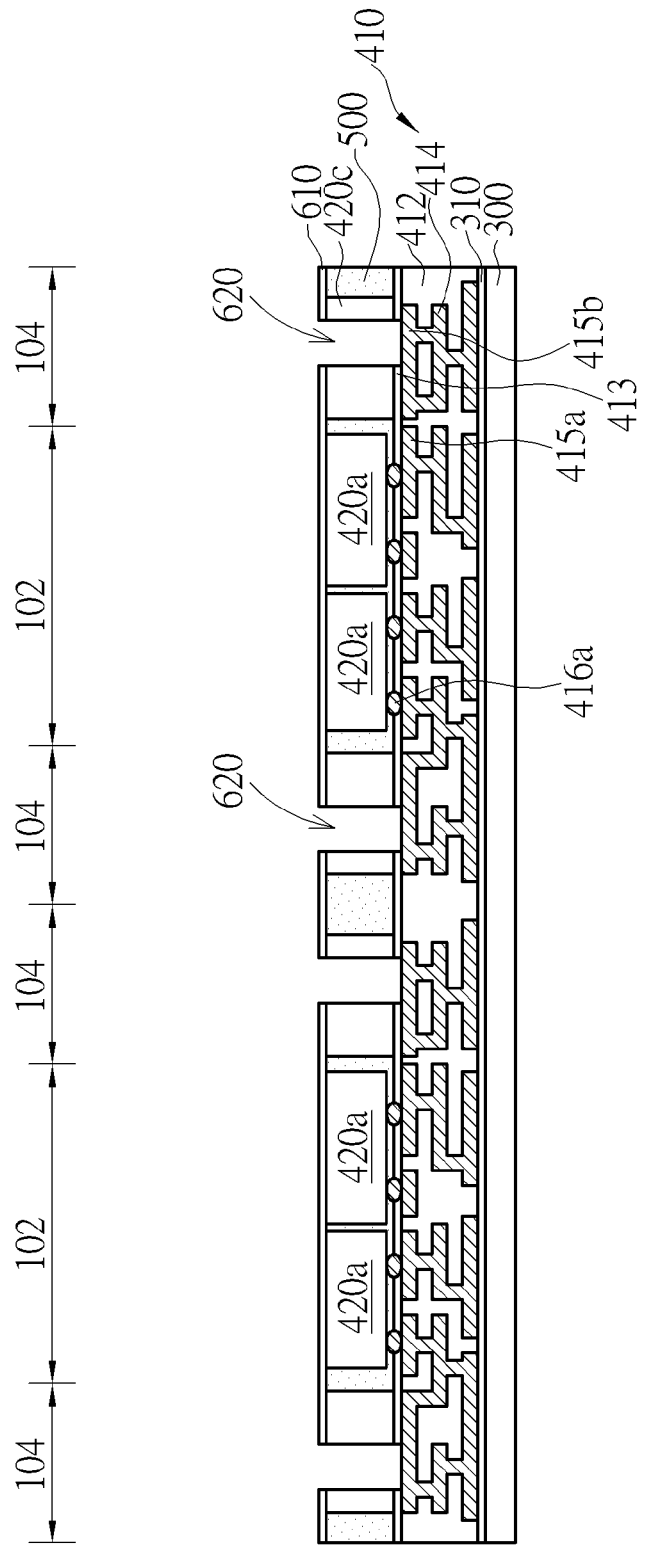

As shown in FIG. 14, a dielectric layer 610 such as a silicon oxide layer is deposited onto the top surfaces of the active chips 420a, the top surfaces of the dummy chips 420c, and the top surface of the molding compound 500. According to the illustrated embodiment, the dielectric layer 610 is deposited in blanket fashion. Thereafter, an etching process is performed to form through substrate vias (TSVs) 620 into the dielectric layer 610 and the dummy chips 420c. The TSVs 620 expose respective pads 415b in the peripheral area 104.

Figure 15:
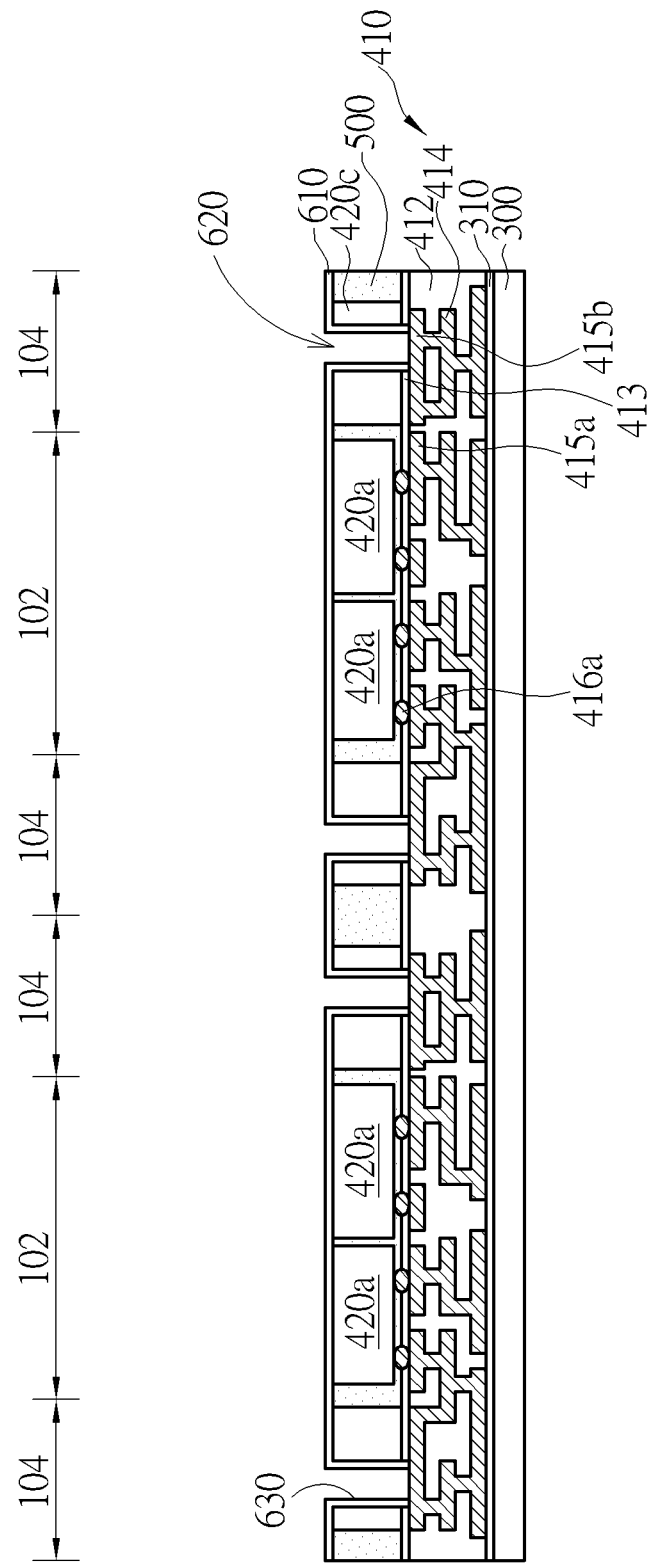

As shown in FIG. 15, an isolation oxide layer 630 is formed on the sidewalls of the TSVs 620. For example, a conformal silicon oxide layer is deposited on the sidewalls and bottom surfaces of the TSVs 620 and on the dielectric layer 610. A dry etching process may be performed to etch away the silicon oxide layer from the bottom surfaces of the TSVs 620 to expose the pads 415b.

Figure 16:
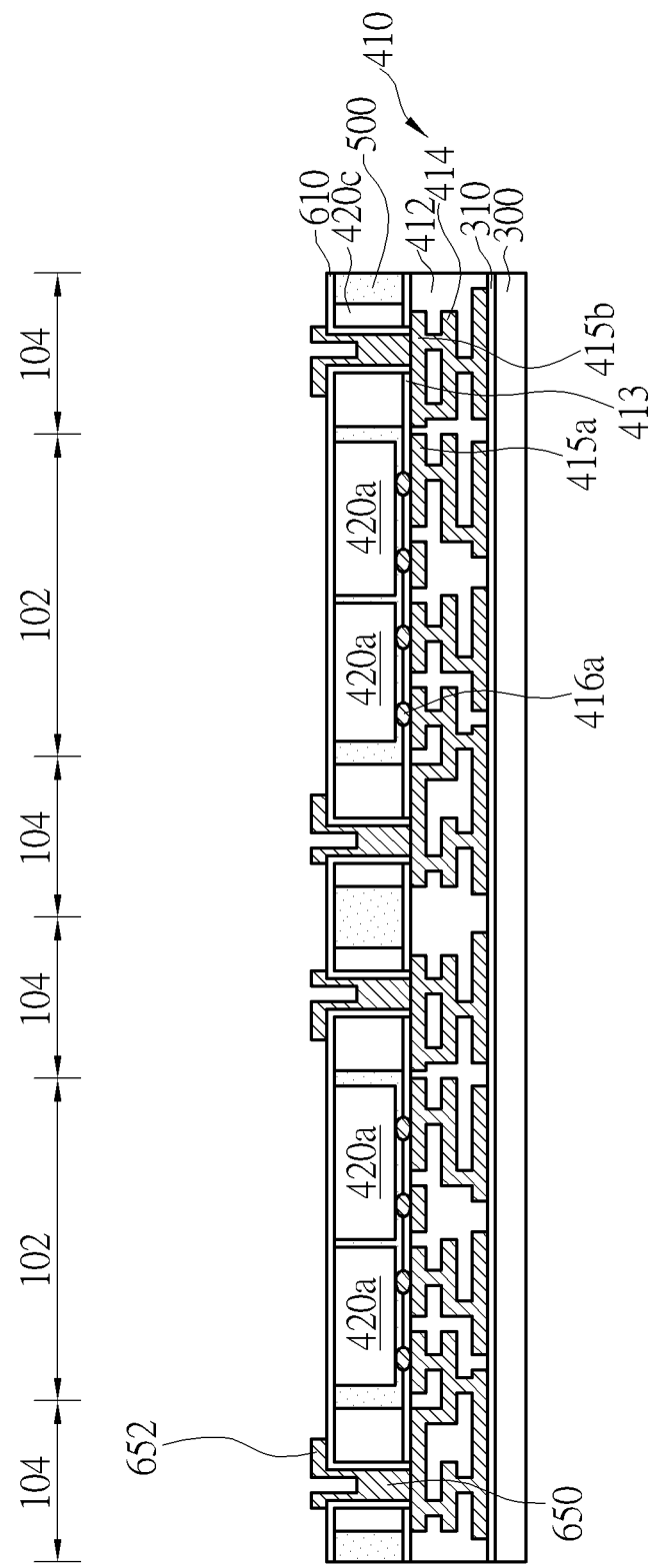

As shown in FIG. 16, a metal filling process is then performed. Each of the TSVs 620 is filled with a metal layer 650. According to the illustrated embodiment, the TSVs 620 may not be completely filled with the metal layer 650. A lithographic process and an etching process may be performed to form a metal trace pattern 652 such as a bump pad on the dielectric layer 610.

Figure 17:
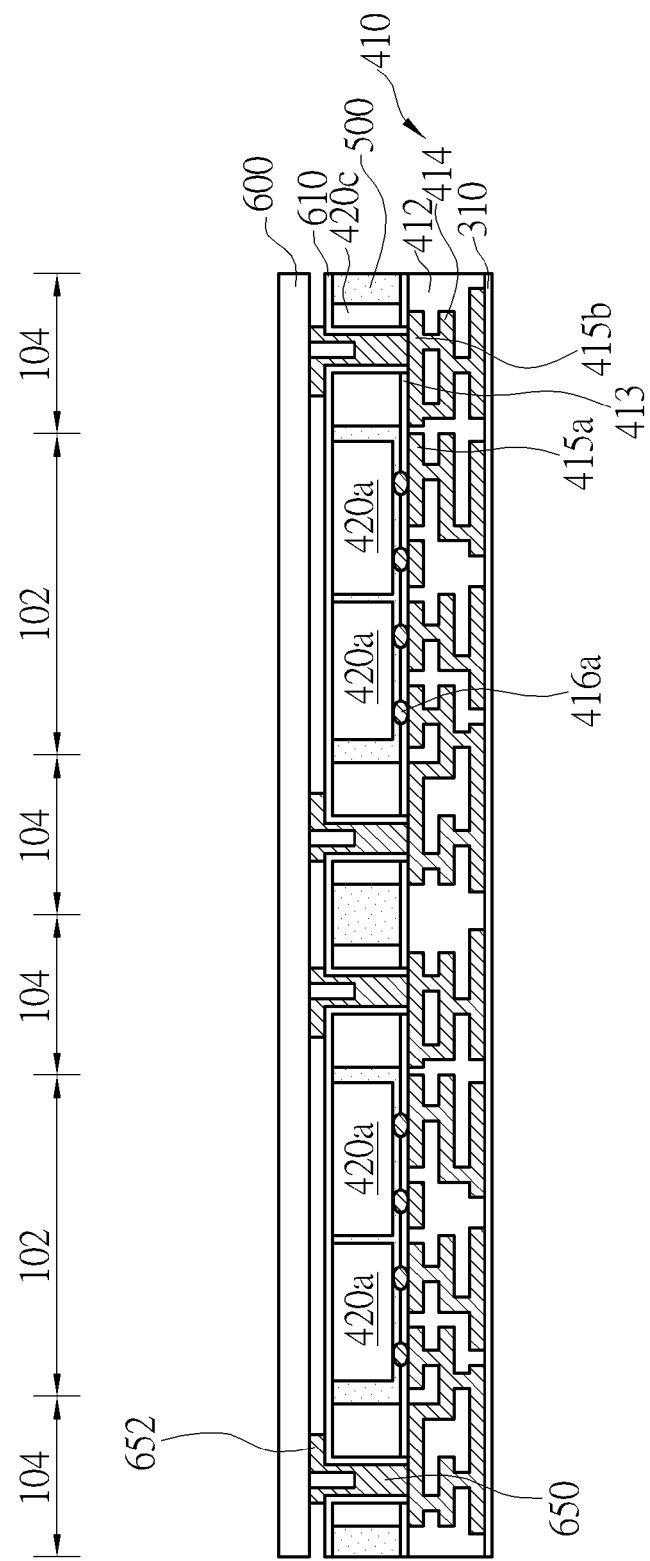

As shown in FIG. 17, the wafer level package is then adhered to another carrier 600. The metal trace pattern 652 faces toward, and may contact, the carrier 600. The carrier 600 may be a glass substrate, but not limited thereto. Optionally, an adhesive layer or a glue layer (not shown) may be used to attach the wafer level package to the carrier 600. Subsequently, the carrier 300 is removed to thereby expose a major surface of the passivation layer 310. The de-bonding of the carrier 300 may be performed by using a laser process or UV irradiation process, but not limited thereto.

Figure 18:
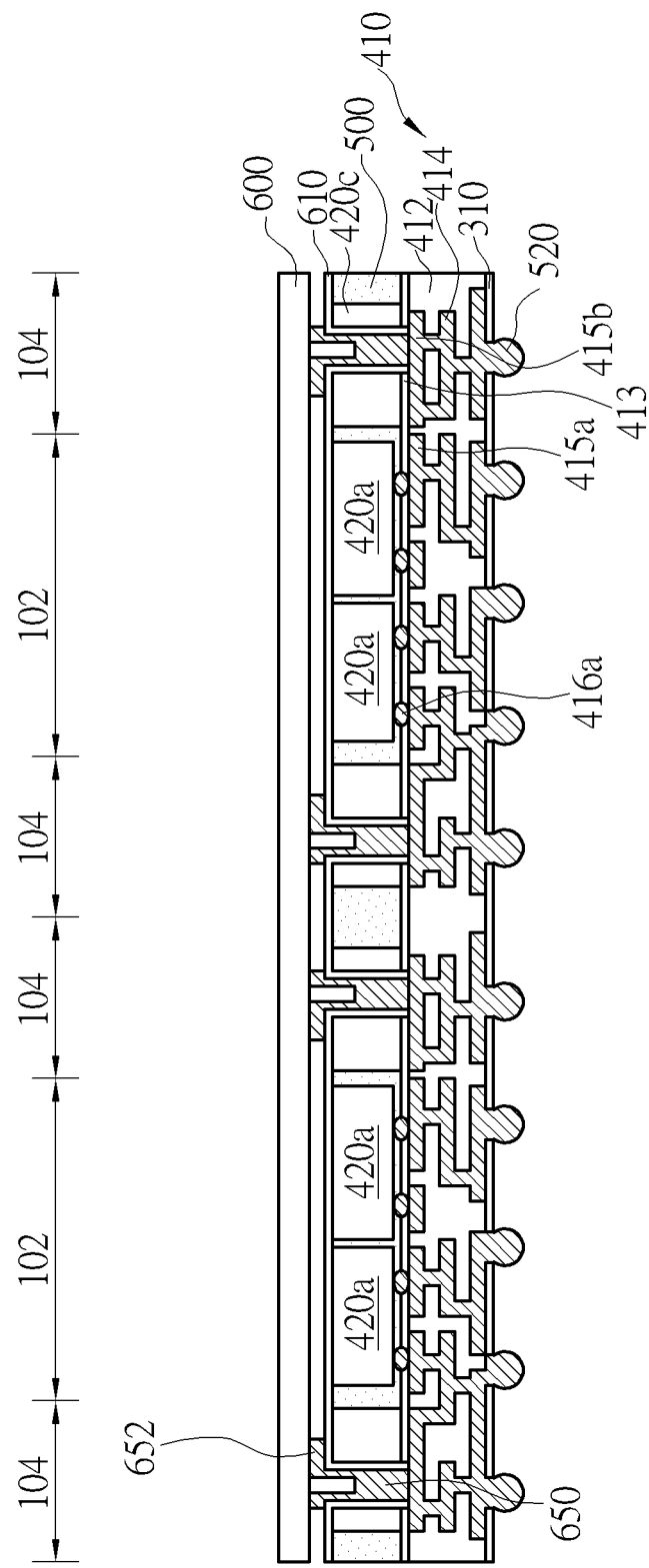

As shown in FIG. 18, after de-bonding the carrier 300, openings may be formed in the passivation layer 310 to expose respective solder pads, and then solder bumps or solder balls 520 may be formed on the respective solder pads. Thereafter, the carrier 600 is removed to expose the metal trace pattern 652.

Figure 19:
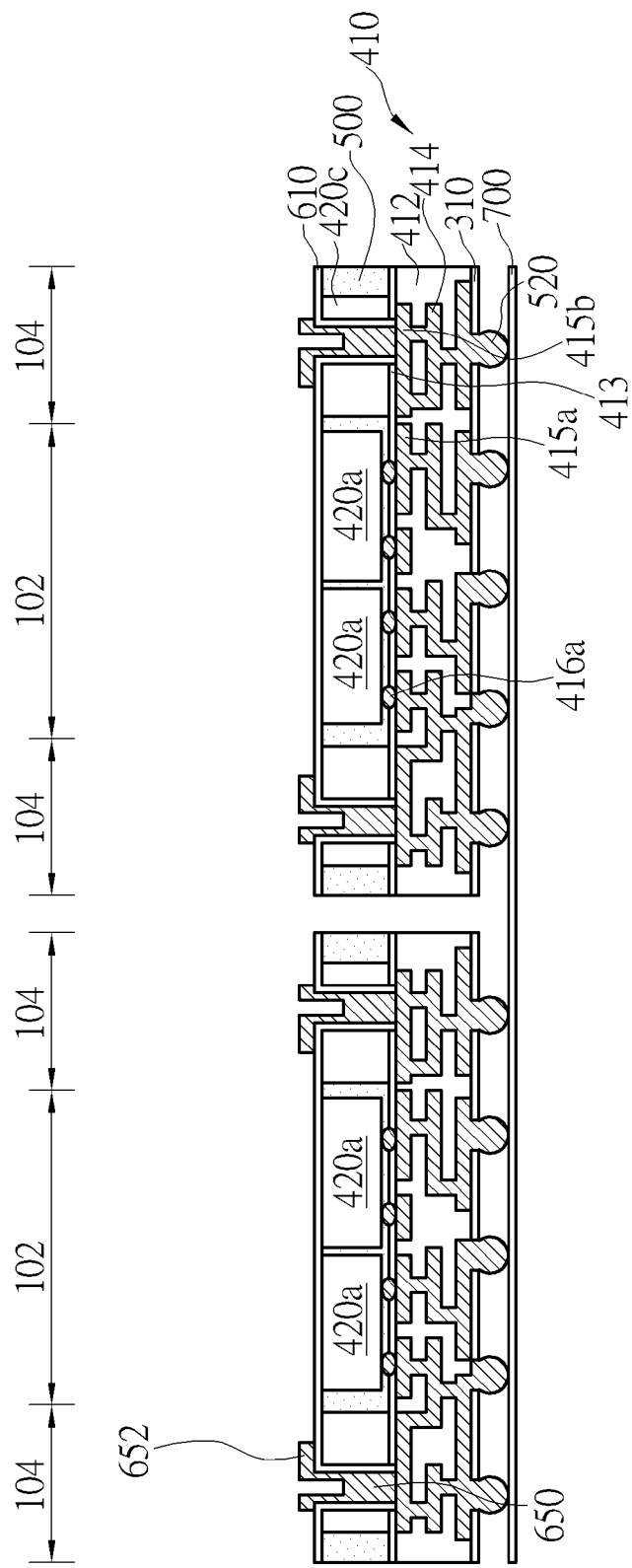

As shown in FIG. 19, after the carrier 600 is removed, the wafer level package is then diced and singulated into individual die package 10. For example, the wafer level package may be first attached to a dicing tape 700, where the solder bumps 520 faces toward, and may contact, the dicing tape 700.

Figure 20:
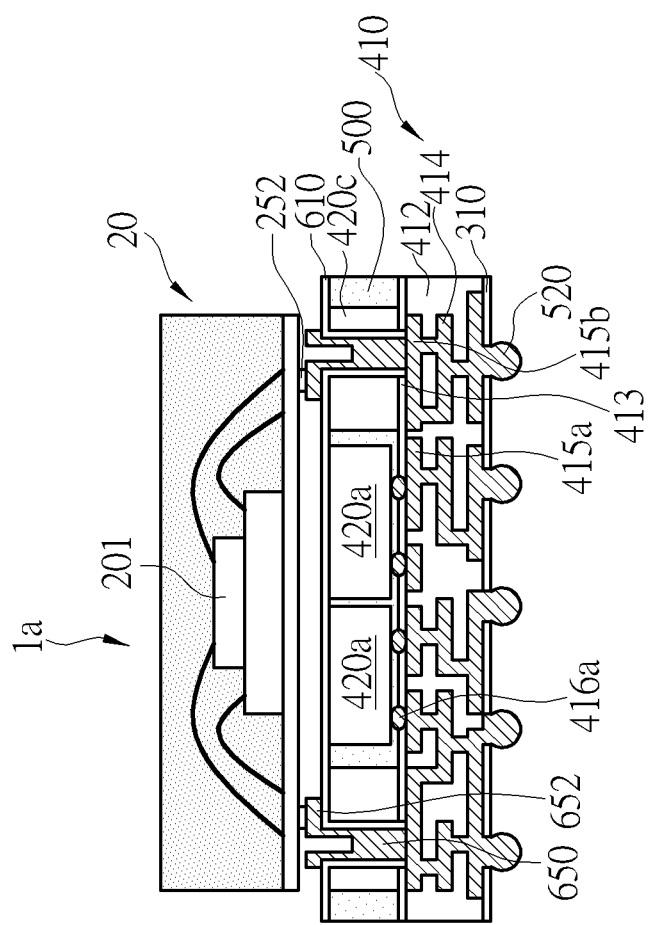

As shown in FIG. 20, a die package 20 comprising at least a molded semiconductor die 201 is mounted on the die package 10 to thereby form a PoP assembly 1a. The die package 20 may be electrically connected to the die package 10 through the bumps 252, the metal trace pattern 652 and the TSVs 620.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A package-on-package (PoP) assembly, comprising:
   a bottom die package comprising
   an interposer having a first side and a second side opposite to the first side;
   at least one active chip mounted on the first side within a chip mounting area through a plurality of first bumps;
   at least one dummy chip mounted on the first side within a peripheral area being adjacent to the chip mounting area, wherein the dummy chip is directly mounted on a passivation layer of the interposer;
a dielectric layer covering the at least one active chip and the at least one dummy chip;
at least one TSV connecter penetrating through the dielectric layer and the dummy chip;
a molding compound disposed on the first side, the molding compound covering the at least one active chip and the at least one TSV chip; and
a plurality of solder bumps mounted on the second side;
a top die package mounted on the bottom die package.

2. The PoP assembly according to claim 1, wherein the dummy chip is directly mounted on the passivation layer by using an adhesive.

3. The PoP assembly according to claim 1, wherein TSV connecter is electrically connected to a metal trace pattern on the dielectric layer.

4. The PoP assembly according to claim 3, wherein the top die package is mounted on the bottom die package through a plurality of second bumps disposed on the metal trace pattern.

\* \* \* \* \*